United States Patent [19]

Kronenberg

[11] Patent Number: 5,032,781
[45] Date of Patent: Jul. 16, 1991

[54] METHOD AND CIRCUIT FOR OPERATING A STEPPING MOTOR

[75] Inventor: Klaus Kronenberg, Schwalbach, Fed. Rep. of Germany

[73] Assignee: VDO Adolf Schindling AG, Frankfurt am Main, Fed. Rep. of Germany

[21] Appl. No.: 475,047

[22] Filed: Feb. 2, 1990

[30] Foreign Application Priority Data

Feb. 14, 1989 [DE] Fed. Rep. of Germany ....... 3904332
Jun. 30, 1989 [DE] Fed. Rep. of Germany ....... 3921462

[51] Int. Cl.⁵ .............................................. H02P 8/00
[52] U.S. Cl. .................................. 318/696; 318/685; 400/903
[58] Field of Search ................. 318/696, 685; 400/903

[56] References Cited

U.S. PATENT DOCUMENTS

| | | | |
|---|---|---|---|
| 4,282,471 | 8/1981 | Budniak et al. ..................... | 318/696 |
| 4,449,086 | 5/1984 | Hoffmann et al. .................. | 318/696 |
| 4,602,822 | 7/1986 | Akazawa ......................... | 400/903 X |
| 4,683,410 | 7/1987 | Kressirer et al. ................... | 318/696 |

FOREIGN PATENT DOCUMENTS

| | | |
|---|---|---|
| 0046722 | 3/1982 | European Pat. Off. . |
| 3535666 | 10/1985 | Fed. Rep. of Germany . |
| 2576469 | 7/1986 | France . |

*Primary Examiner*—William M. Shoop, Jr.
*Assistant Examiner*—Saul M. Bergmann
*Attorney, Agent, or Firm*—Martin A. Farber

[57] ABSTRACT

In a method and circuit for operating a stepping motor having several windings, and wherein a movement of the stepping motor induces a voltage in a winding which is not required at the time for generating a propulsive force, the induced voltage is evaluated. After the stepping motor is connected, the stepping motor is operated in a predetermined direction, whereupon a stopping of the stepping motor is detected by the absence of the induced voltage. A memory containing the instantaneous position of the stepping motor is then set to a predetermined value.

6 Claims, 4 Drawing Sheets

METHOD AND CIRCUIT FOR OPERATING A STEPPING MOTOR

FIELD AND BACKGROUND OF THE INVENTION

The present invention relates to a method and an electric circuit for operating a stepping motor having several windings.

Upon the operation of a stepping motor, in particular one having a transmission connected behind it, information concerning the instantaneous position of the stepping motor or of the transmission output drive is frequently required. For this purpose, sensors, such as, for example, proximity switches, mechanical limit switches and light barriers are known. Such sensors, however, require an additional expense in the form of parts and assembly time which has a detrimental effect on the cost. Such additional equipment furthermore results in increased volume of the corresponding structural unit.

Such sensors are required, in particular, for initializing a control device for a stepping motor after connection of the device to the motor, in such a manner that a predetermined relationship between the data present in the control device and the actual position of the stepping motor or transmission output drive is reestablished.

It is an object of the present invention to provide a method for operating a stepping motor having several windings in which movement of the motor can be determined without additional sensors.

SUMMARY OF THE INVENTION

According to the invention, a voltage induced in a winding of the stepping motor by a movement of the stepping motor, which winding which is not required at the time for generation of a propulsive force, is evaluated. In this way, it can be determined, without further sensors, whether the stepping motor is in motion or at rest.

A further aspect of the method of the invention provides that, after connection of the control device to the motor, the stepping motor is driven in a predetermined direction. Thereafter a stopping of the stepping motor is determined by the absence of an induced voltage, and that a memory storing the instantaneous position of the stepping motor is then set at a predetermined value. This makes possible an initialization by virtue of the fact that a relationship between the position of the transmission output drive, or the stepping motor, and the data present in a control device or in a microcomputer, which was lost upon a disconnection of motor and control device is established again upon connection.

Upon a movement of the rotor of the stepping motor, an exponentially fading oscillation is induced within one step in a winding which is not required at the time for generation of a propulsive force, the winding assuming a different polarity from step to step in rotation of the rotor. However, if a first maximum of the induction voltage having a predetermined polarity is evaluated, this leads to different results from step to step. In order to avoid this it is provided, in accordance with another aspect of the method of the invention, that the voltage induced in the foregoing winding is evaluated from step to step alternately with different polarity.

One advantageous circuit for carrying out the method of the invention provides that the windings (5,6) of the stepping motor can be optionally connected by switch means (7,8; 9,10) to outputs of driver stages (1,2; 3,4) or to the input of a detector element (11) or ground, and that the switch means (7,8; 9,10) and the driver stages can be controlled by a control logic 12.

In this case it can preferably be provided that a switching means with two changeover switches (7,8; 9,10) which are controlled in parallel is provided for each winding (5,6), one (7,9) of said switches connecting a first terminal of the winding (5,6) either with the output of a first driver stage (1,3) or with the input of a detector element (11), and a second changeover switch (8,10) connecting a second terminal of the winding (5,6) either with the output of a second driver stage (2,4) or with ground potential.

Further according to a feature of the invention, the detector element is a threshold circuit (11).

Still further according to the invention, the control logic (12) can be controlled by a microcomputer (14), the output of the detector element (11) is connected to an input of the microcomputer (14), and a memory is provided for the position of the stepping motor.

Another feature of the invention is that the stepping motor is provided with a transmission (18) on an output drive (19) of which there is arranged a stop (20) which limits movement of the transmission (18) and of the stepping motor.

In order to avoid the above-mentioned disadvantages due to the changing polarity of the induced voltage, it is provided, in a further development of the circuit of the invention, that the switch means (27,28,29,30) have in each case 3 switch positions, that in a first switch position a corresponding winding (5,6) of the stepping motor is connected to outputs of the driver stages (1,2; 3,4); that in a second switch position a first terminal of the corresponding winding (5,6) is connected to ground, and a second terminal of the winding (5,6) is connected to the input of the detector element (11); and that in a third switch position the first terminal of the winding (5,6) is connected to the input of the detector element (11), and the second terminal of the winding (5,6) is connected to ground.

BRIEF DESCRIPTION OF THE DRAWING

With the above and other objects and advantages in view, the present invention will become more clearly understood in connection with a detailed description of preferred embodiments, when considered with the accompanying drawings, of which.

Identical parts in the figures have been provided with the same reference numbers.

DETAILED DESCRIPTION OF THE PREFERRED EMBODIMENT

Figure 1:
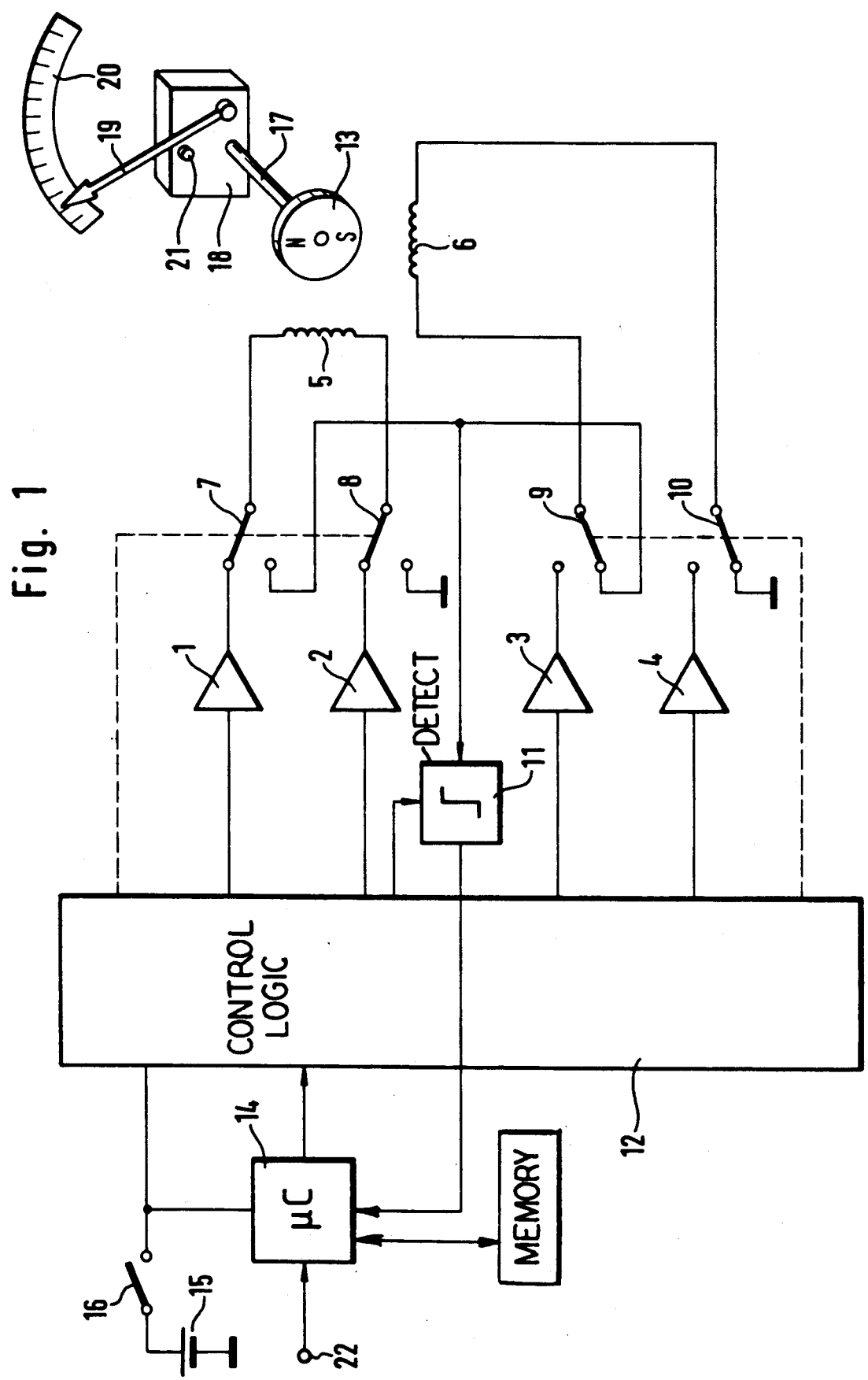
FIG. 1 is a circuit diagram of a first embodiment, partially developed as a block diagram.

In the embodiment shown in FIG. 1, four driver stages 1, 2, 3, 4 are provided by which the windings 5, 6 of a stepping motor can be subjected to voltage. The stepping motor comprises a permanent-magnetic rotor 13, which is driven in manner known per se by alternating magnetic fields in the windings 5, 6. Each one of the windings 5, 6 is, in this connection, acted on by a current in such a direction that the magnetic pole N, S lying in the direction of movement is attracted while the other winding remains without current during that time.

A control logic 12 serves to produce corresponding pulses which are fed to the windings 5, 6 via the driver stages 1 to 4. Since the production of control voltages for stepping motors is known per se, the control logic 12 need not be described in detail in order to explain the invention. One input of the control logic 12 is connected to the output of a microcomputer 14. Furthermore, the microcomputer 14, the control logic 12, a detector 11 and the driver stages 1 to 4 are supplied with an operating voltage, as is indicated in FIG. 1 diagrammatically by a voltage source 15 and a switch 16.

In this embodiment, the stepping motor serves to drive a display instrument. For this purpose, the driven shaft 17 of the stepping motor is connected via a transmission 18 to a pointer 19 which moves over a scale 20. A stop 21 for the pointer 19 is provided near the zero mark of the scale 20.

For the carrying out the method of the invention, changeover switches 7, 8, 9, 10 are arranged between the outputs of the driver stages 1 to 4 and the terminals of the windings 5 and 6, the switches being controlled by the control logic 12. The changeover switches 7, 8, 9, 10 can be formed in known manner by suitable semiconductor switches. The windings can be connected by the changeover switches 7, 8, 9, 10 either to the outputs of the driver stages 1-4 or to the input of the detector 11, the detector 11 being a threshold circuit. Specifically, the winding which is to be supplied with current is connected to the outputs of the driver stages associated with it, while one terminal of the winding which is not to be supplied with current is connected to a ground potential and the other terminal of this winding is connected to the input of the detector 11.

The output of the detector 11 is connected to an input of the microcomputer 14. For this there is preferably used an input IR for the interruption of the program (Interrupt) so that the evaluation of the output voltage of the threshold circuit can be effected immediately. Since an evaluation of the induced voltage is not meaningful at all times, the detector 11 is activated by the control logic 12 at a suitable time in each case.

In the embodiment shown in FIG. 1, a variable which is to be displayed and is fed at 22, and is converted by means of the microcomputer 14 into a number of steps which the stepping motor then carries out in order duly to display the variable. If the operating voltage is disconnected by opening the switch 16 then the stepping motor and thus the pointer 19 remain in the position which they had reached at that time. Upon the reconnecting of the circuit, no relationship therefore exists any longer between a number of steps calculated by the microcomputer 14 and the actual position of the pointer 19. Therefore, after the connecting, so-called initialization takes place in the manner that the stepping motor is supplied with current in such a manner that the pointer 19 comes against the stop 21. During this time, the induced voltage or the output signal of the detector 11 is evaluated until no voltage is induced. This is an indication that the stepping motor has stopped or that the pointer 19 has come against the stop 21. A memory which is operative with the microcomputer 14 and which has been storing the instantaneous position of the pointer 19, or equivalently the position of the rotor 13 via the transmission 18, is now set to zero or to some other suitable predetermined value representative of position. The microcomputer 14 is then ready to convert a variable fed at 22 into a corresponding number of steps and to feed the corresponding number of pulses to the stepping motor via the control logic 12.

Figure 2:
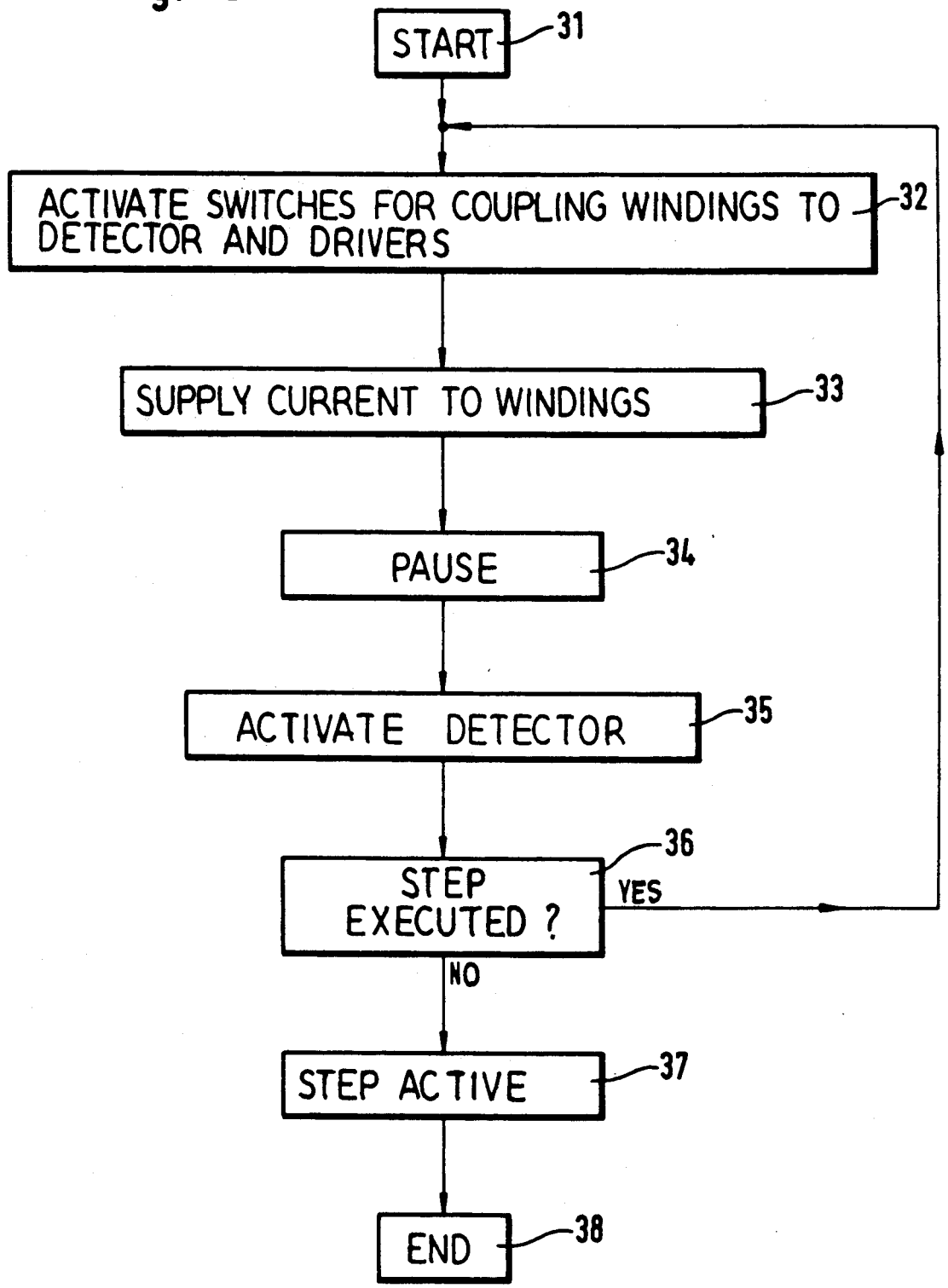
FIG. 2 is a flow sheet of a computer program provided for implementing the method of the invention.

FIG. 2 shows a flow sheet of that part of the microcomputer program which serves to carry out the method of the invention. After the start at 31, the changeover switches 7-10 are so actuated in the program part 32 that the winding 5 or 6 is connected to the detector 11 and the winding 6 or 5 to the driver stages. In the program part 33, the winding 5 or 6 is then supplied with current. After a pause 34, the detector 11 is activated at 35, whereby a signal which corresponds to the induced voltage is fed to the microcomputer.

At program part 36 the program proceeds depending on whether a step was carried out. If the step has been performed, then the stepping motor is acted on for the next step via the program parts 32 and 33. After the pause 34, an inquiry whether a step was carried out takes place again at parts 35 and 36 by activation of the detector 11. The foregoing loop is repeated until the pointer 19 strikes against the stop 20. It is then noted that no induced voltage is present any longer and that therefore no step was carried out any longer. The program therefore passes from the branching 36 to block 37 for an "step active" output which means that a actually operational movement of the pointer is now possible. The program is ended at 38.

Figure 3:
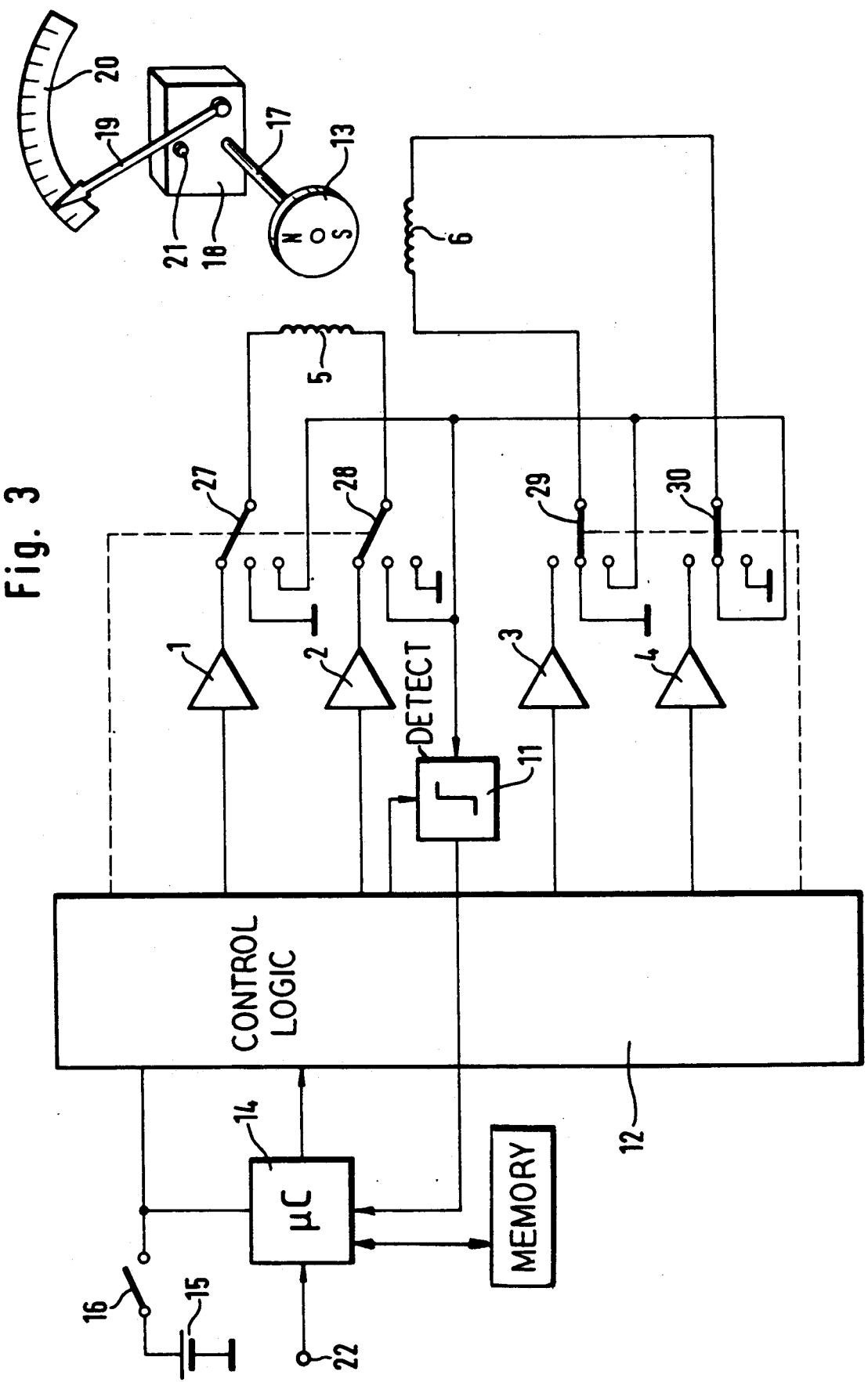
FIG. 3 is a circuit diagram of a second embodiment.
Figure 4A:
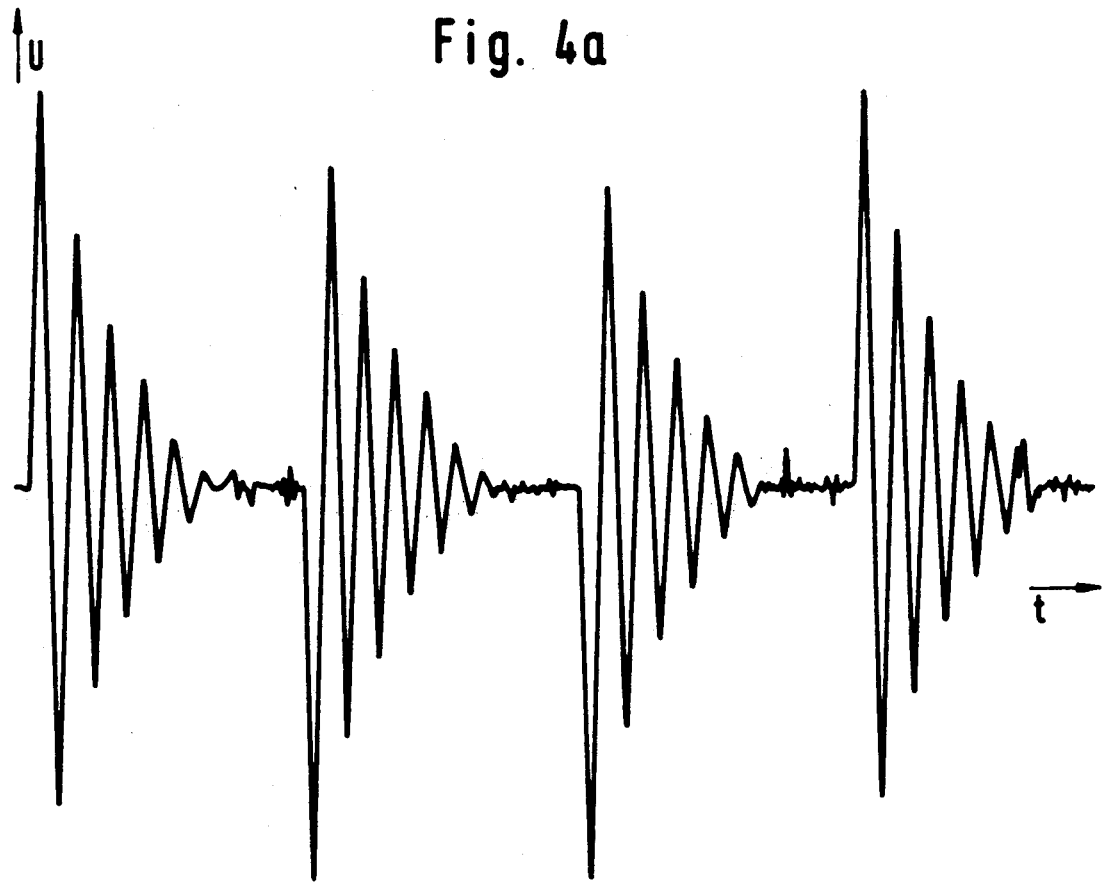
FIGS. 4a and 4b, show voltage-time diagrams of the induced voltage by way of explanation of the second embodiment.

The embodiment of FIG. 3 differs from the first embodiment by the fact that each of the changeover switches 27, 28, 29, 30 is provided with three switch positions. In the upper position, the corresponding winding is connected, as in the first embodiment, to the outputs of the driver stages 1,2; 3,4. In the second, center position, one terminal of the winding 5, 6 is connected to ground potential and the other terminal to the input of the detector 11. In the third position, the polarity of the winding is reversed with respect to the second position. The changeover switches 27-30 are so controlled by the control logic 12 that the windings 5, 6 are supplied with current alternately and the winding which is without current at the time is connected, stepwise alternately with different polarity, to the input of the detector 11. FIG. 4a shows the course of the voltage at the input of the detector 11 during the course of four steps in the circuit arrangement of FIG. 1. Four attenuated trains of oscillation are produced in this case, two by each of the windings 5, 6. Upon every second currentless phase of a winding, the polarity of the attenuated oscillation is reversed. Thus the value of the first maximum also changes with a given sign. Since this value is evaluated by the detector 11, variations between the individual steps result in the circuit of FIG. 1.

Figure 4B:
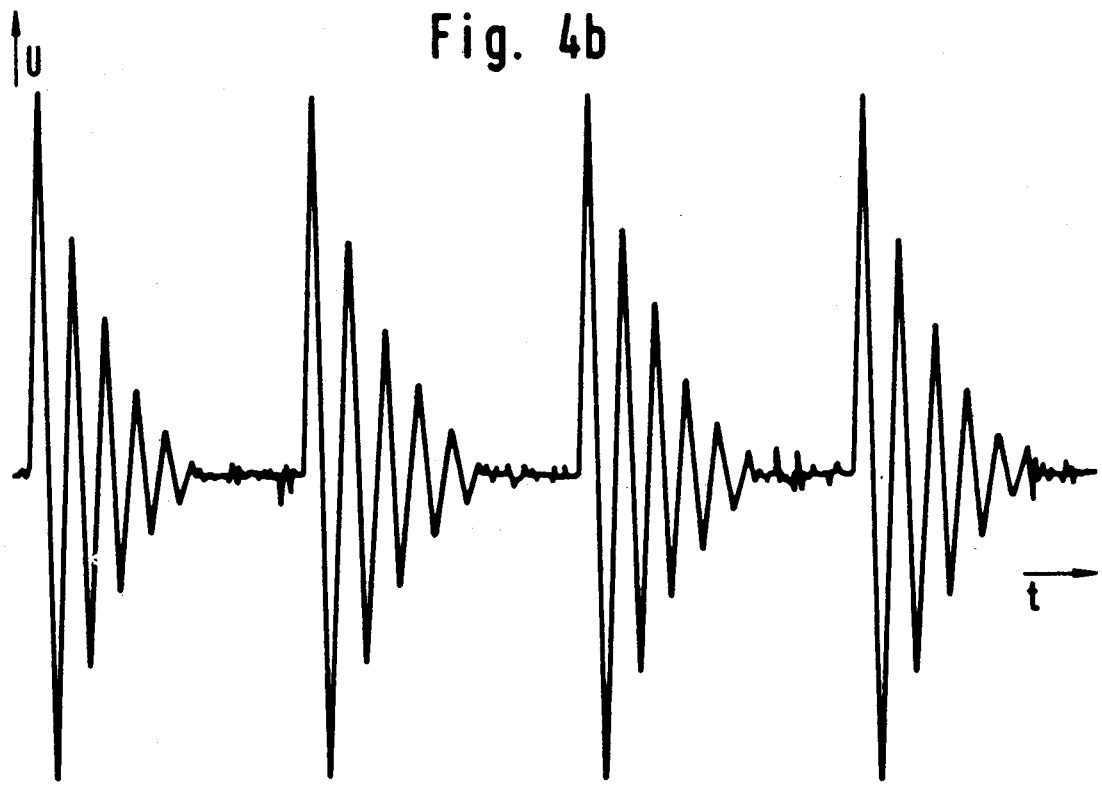

Due to the rectifying action of the changeover switches 27-30 in the circuit arrangement of FIG. 3, the first maximum in each case will be of the same magnitude from step to step. This can be noted from FIG. 4b.

While the operation and construction of the invention has been demonstrated for a motor having the two windings 5 and 6, it is to be understood that the description applies also to stepping motors having four windings, eight windings or more windings, the two-winding case having been selected to facilitate description of the invention.

I claim:

1. A method for operating a stepping motor having plural windings, comprising the steps of energizing one of said windings during an interval of time when a second of said windings is deenergized;

evaluating a voltage induced in a deenergized winding, the induced voltage resulting from movement of the rotor of the stepping motor relative to the stator of the stepping motor;

driving the motor towards a stop;

observing a cessation of induced voltage upon a stoppage of the motor by the stop;

setting a memory with position of the stop; and storing instantaneous position of the rotor of the motor in the memory.

2. The method according to claim 1, wherein said evaluating step is performed repetitively, said evaluating step including a step of inverting polarity of a voltage induced on a deenergized winding upon each repetition of said evaluating step.

3. A circuit for operating a stepping motor having plural windings, the circuit comprising switch means and a control logic unit, driver stages connected to respective one of said plural windings, a detector activated by said control logic unit; and wherein said switch means selectively connects said windings to outputs of said driver stages or to an input of said detector or ground, said switch means and said driver stages being controlled by said logic unit to energize one of said windings concurrently with a deenergizing of a second of said windings, energization and deenergization of said windings proceeding repetitively in alternating fashion;

said detector signals presence of an induced voltage in a deenergized winding, the induced voltage resulting from movement of a rotor of the stepping motor relative to a stator of the stepping motor;

said switching means comprises two changeover switches which operate in parallel, there being one of said changeover switches for each of said windings, two of said driver stages being connectable by a first of said changeover switches to a first of said windings, a further two of said driver stages being connectable by a second of said changeover switches to a second of said windings;

for the connecting of each winding by its switch to the respective driver stages, a first part of the switch connects a first terminal of the winding either with the output of a driver stage or with the input of the detector, and a second part of the switch connects a second terminal of the winding either with the output of a second driver stage or with ground potential;

said stepping motor is provided with a transmission having an output drive, there being a stop operative with the output drive to limit movement of the transmission and of the stepping motor; and wherein said circuit comprises a microprocessor coupled to said control logic unit for driving said motor toward said stop to initialize operation of said motor.

4. A circuit according to claim 3, wherein the detector is a threshold circuit.

5. A circuit according to claim 3, further comprising a microcomputer and memory; and wherein said logic unit is controllable by said microcomputer, and an output of said detector is connected to an input of the microcomputer, and said memory stores a position of the rotor of the stepping motor.

6. A circuit according to claim 3, wherein the switch means comprises a plurality of switches each having three switch positions; and wherein, in a first switch position, a winding of the stepping motor is connected to outputs of the driver stages;

in the second switch position a first terminal of the winding is connected to ground and a second terminal of the winding is connected to the input of the detector; and in the third switch position the first terminal of the winding is connected to the input of the detector and the second terminal of the winding is connected to ground.

* * * * *